(12) United States Patent
Shah (10) Patent No.: US 7,166,905 B1
(45) Date of Patent: Jan. 23, 2007

(54) STACKED PADDLE MICRO LEADFRAME PACKAGE

(75) Inventor: Jitesh Shah, Freemont, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 87 days.

(21) Appl. No.: 10/958,697

(22) Filed: Oct. 5, 2004

(51) Int. Cl.
*H01L 23/495* (2006.01)

(52) U.S. Cl. ..................... 257/666; 257/676
(58) Field of Classification Search ............... 257/666, 257/676
See application file for complete search history.

(56) References Cited

U.S. PATENT DOCUMENTS

| 5,386,141 | A |   | 1/1995  | Liang et al. |          |
|-----------|---|---|---------|--------------|----------|
| 5,451,812 | A |   | 9/1995  | Gomi         |          |
| 5,457,340 | A |   | 10/1995 | Templeton, Jr. et al. | |
| 5,734,198 | A | * | 3/1998  | Stave ................... | 257/666 |
| 5,757,070 | A |   | 5/1998  | Fritz        |          |
| 6,208,023 | B1| * | 3/2001  | Nakayama et al. ......... | 257/696 |
| 6,465,882 | B1|   | 10/2002 | Cohn et al.  |          |
| 6,781,219 | B1| * | 8/2004  | Bissey ................ | 257/666 |

\* cited by examiner

*Primary Examiner*—Roy Potter
(74) *Attorney, Agent, or Firm*—Kenneth Glass; Glass & Associates

(57) ABSTRACT

A micro leadframe package and a method for forming a micro leadframe package are disclosed in which two leadframes that include paddles are coupled together such that only dielectric material extends between the two paddles. Semiconductor die are attached to paddles on the top leadframe, and a wire bonding process is then performed, followed by a molding process, plating, and a singulation process. This forms a micro leadframe package that, when ground is coupled to one paddle and power is coupled to the other paddle, provides a low inductance path for both power and ground supply to the semiconductor die. Moreover, as only dielectric material extends between the two paddles, the two paddles and the dielectric material that extends between the paddles form a capacitor, providing decoupling capacitance within the micro leadframe package.

14 Claims, 9 Drawing Sheets

STACKED PADDLE MICRO LEADFRAME PACKAGE

FIELD OF THE INVENTION

The present invention relates to the field of semiconductor devices. More specifically, the present invention relates to packaging of semiconductor devices.

BACKGROUND ART

In conventional semiconductor packaging processes semiconductor die are glued to die-attach regions of a leadframe. A wire bonding process is performed to electrically connect the leads to the contacts on the semiconductor die. A transfer molding process is then performed, followed by a singulation process that produces individual packaged semiconductor devices.

One type of package, commonly referred to as a micro leadframe package, includes leads that are disposed on the periphery of the package. The requirement that leads extend on the periphery of the package limits the amount of interconnections available for any given package size. This prevents the use of micro leadframe packages for semiconductor devices that have more contacts than the number of leads. However, some micro leadframe packages include an exposed paddle, allowing for connection of some of the contacts on the semiconductor die directly to the paddle. This allows, for example, for all of the ground contacts on the semiconductor die to be coupled to the paddle, freeing up leads for power and signal contacts. Though this allows for packaging of semiconductor die having more contacts than micro leadframe packages that do not have an exposed paddle, there is still an insufficient number of leads available for packaging semiconductor devices that have a high number of power, ground and signal contacts.

High frequency semiconductor devices such as semiconductor devices for processing communications signals, and in particular telecom signals, have an almost instantaneous need for current as devices turn on and off. Any drop in the power supply can adversely affect the operation of the semiconductor device. Moreover, these high frequency devices require low impedance in the power supply network. To prevent rail collapse in high frequency semiconductor devices, decoupling capacitance is often provided in the form of capacitors that are located near the packaged semiconductor device on the circuit board. However, this adds additional cost as additional components must be attached to the circuit board. In addition, as frequencies continue to increase, capacitors disposed on the circuit board may not be close enough to the semiconductor die to prevent rail collapse.

Accordingly, there is a need for a micro leadframe package design that will allow for connection of high frequency semiconductor devices and that will prevent rail collapse. In addition, there is a need for a micro leadframe package that will allow for connection of semiconductor die having a high number of power, ground and signal contacts. The present invention meets the above needs.

DISCLOSURE OF THE INVENTION

The present invention provides a micro leadframe package and a method for forming a micro leadframe package that allows for connection of semiconductor die having a high number of power, ground and signal contacts, and that includes decoupling capacitance within the micro leadframe package for preventing rail collapse in high frequency semiconductor devices.

A process for forming a packaged semiconductor device is disclosed in which two leadframes that include paddles are coupled together such that only dielectric material extends between paddles. In the present embodiment the top leadframe includes some leads that extend from the paddle, and some leads that are spaced apart from the paddle. Semiconductor die are attached to paddles on the top leadframe, and a wire bonding process is performed to electrically couple the semiconductor die to the paddles and to some of the leads. A molding process is performed, the molded leadframe is plated with tin/lead plating, and a singulation process is performed so as to form individual packaged semiconductor devices.

The use of two paddles allows for ground to be coupled to one paddle and power to be coupled to the other paddle, freeing up contacts for connection to signal contacts on the semiconductor die, allowing for the packaging of semiconductor die having a high number of power, ground and signal contacts.

The use of two paddles provides a low inductance path for both power and ground supply to the semiconductor die. Moreover, as only dielectric material extends between the two paddles, the two paddles and the dielectric material that extends between the paddles form a capacitor that stores charge for use by the semiconductor die. This provides decoupling capacitance within the package itself, allowing for packaging of high frequency semiconductor devices and preventing rail collapse.

These and other advantages of the present invention will no doubt become obvious to those of ordinary skill in the art after having read the following detailed description of the preferred embodiments, which are illustrated in the various drawing figures.

BRIEF DESCRIPTION OF THE DRAWINGS

The accompanying drawings, which are incorporated in and form a part of this specification, illustrate embodiments of the invention, and together with the description, serve to explain the principles of the invention.

The drawings referred to in this description should be understood as not being drawn to scale.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
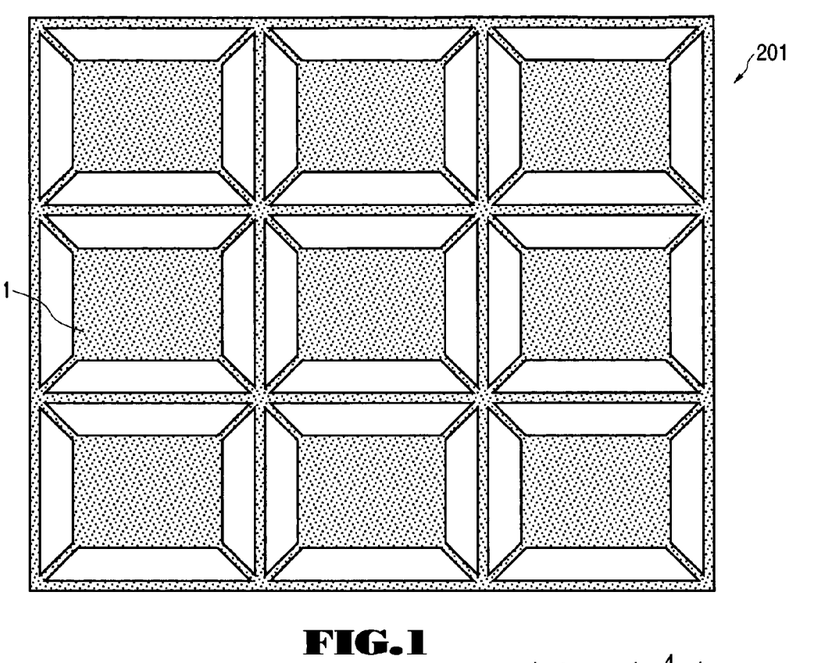
FIG. 1 is a top view of a leadframe that includes paddles in accordance with one embodiment of the present invention.
Figure 2:
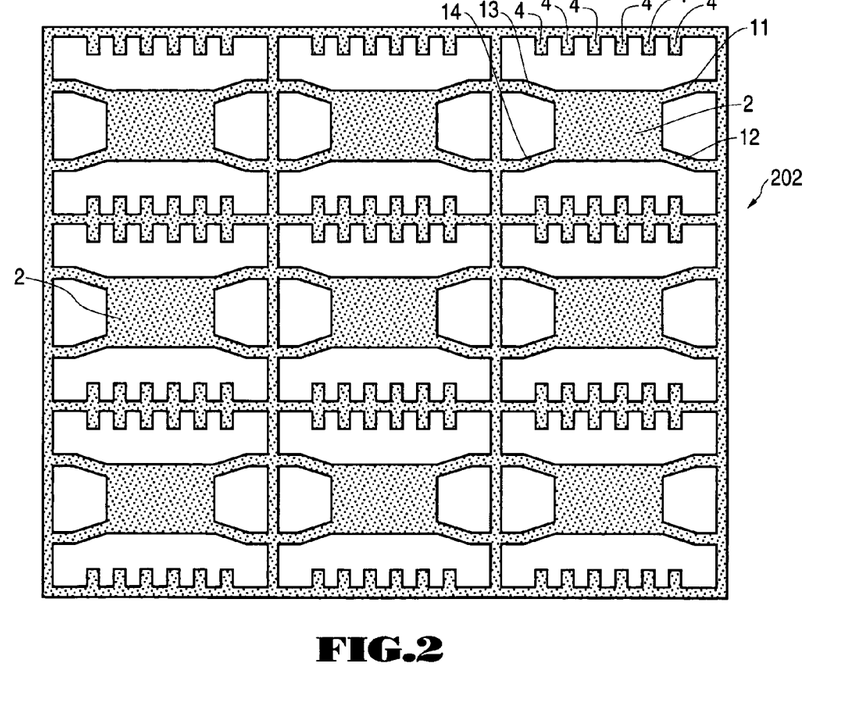
FIG. 2 is a top view of a leadframe that includes paddles and leads, with some of the leads extending from the paddle, and the rest of the leads being separated from the paddle, in accordance with one embodiment of the present invention.

A process for forming a packaged semiconductor device is disclosed in which two paddles are used that are stacked on top of each other. Referring to FIGS. 1–2, a leadframe 201 that includes a paddle 1 is coupled to a second leadframe 202 that includes both a paddle 2, and leads 4 and 11–14. In the present embodiment leadframe 2 includes leads 11–14 that extend from paddle 2 and leads 4 that are separated from paddle 2. Leadframes 201–202 are coupled together using dielectric material that extends between paddles 1–2. In the present embodiment dielectric adhesive is disposed on one of paddles 1–2 and leadframe 202 is disposed over leadframe 201 such that paddles 2 directly overlie paddles 1, with dielectric material extending between paddles 1–2, completely filing the space between paddles 1–2. In one embodiment dielectric material 3 is also a heat conductive material, allowing for effectively conveying heat away from semiconductor die 5 through paddles 1–2 and dielectric material 3. Though dielectric material 3 used in the present embodiment is an adhesive material, it is appreciated that, alternatively, a dielectric material 3 could be used that is not an adhesive.

In the present embodiment a dielectric material 3 is used that has a dielectric constant of 4 or greater. In one specific embodiment, dielectric adhesive 3 is a high dielectric-constant material such as, for example, an adhesive with filler particles formed of aluminum/nickel alloy. In one embodiment a high-dielectric-constant material is used that has a dielectric constant of approximately 20. The high-dielectric constant material can be ground-up barium titanate, in a polymer matrix, made by 3M Corporation.

Figure 3:
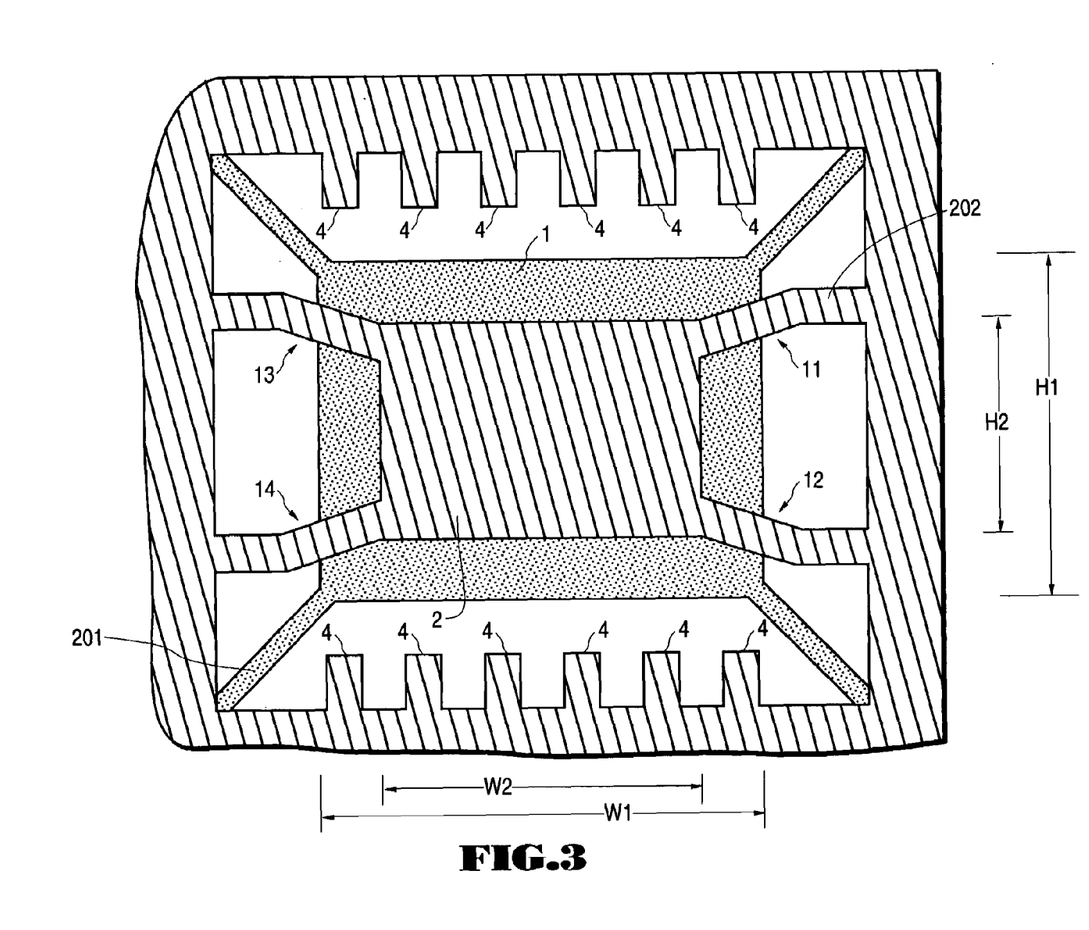
FIG. 3 is a top view of a portion of the leadframes of FIGS. 1–2 after leadframes 1–2 have been coupled together such that dielectric material extends between the leadframes, filling the space between each paddle of the leadframe of FIG. 1 and the corresponding paddle of the leadframe of FIG. 2, in accordance with one embodiment of the present invention.

Referring now to FIG. 3 elongated regions 11–14 extend on opposite sides of paddle 2. These elongated regions form leads 11–14 that are electrically coupled to paddle 2. In the present embodiment leadframes 201–202 are formed of metal or other electrically conductive material. In one specific embodiment leadframes 201–202 are sheets of copper that have been stamped and/or etched so as to form the desired shape.

Referring now to FIG. 3, when leadframe 201 is coupled to leadframe 202 such that paddle 2 extends over paddle 1, portions of paddle 1 are not covered by paddle 2. More particularly, in the present embodiment, paddle 1 is rectangular and has a width $W_1$ and a height $H_1$. Paddle 2 is also rectangular, having a width $W_2$ and a height $H_2$. As the width $W_1$ of paddle 1 is greater than the width $W_2$ of paddle 2, a region of paddle 1 is exposed on each side of paddle 2. Similarly, as the height $H_1$ of paddle 1 is greater than the height $H_2$ of paddle 2, a region of paddle 2 is exposed on the other two sides of paddle 2.

A semiconductor die 5 is attached to leadframe 202. In the present embodiment an adhesive is used to attach semiconductor die 5 to a die attach region in the center of paddle 2. In the present embodiment semiconductor die 5 is a high frequency semiconductor device (a device having a frequency of more than 0.5 Gigahertz).

A wire bonding process is then performed so as to electrically couple semiconductor die 5 to paddles 1–2 and leads 4. In the present embodiment the wire bonding process forms wires 31–33 that electrically couple the contacts of semiconductor die 5 to paddles 1–2 and leads 4. In the present embodiment wires 31–33 are gold. However, other electrically conductive materials could also be used to form wires 31–33.

Molding compound is disposed over leadframes 201–202, semiconductor die 5 and wires 31–33. In the present embodiment, a transfer molding process is used to form molding 20 that covers and protects semiconductor die 5, paddles 1–2 and wires 31–33. The molded leadframe is then prepared for mounting to a printed circuit board by plating it with tin/lead plating. Alternatively, a lead-free plating can be used.

Figure 4:
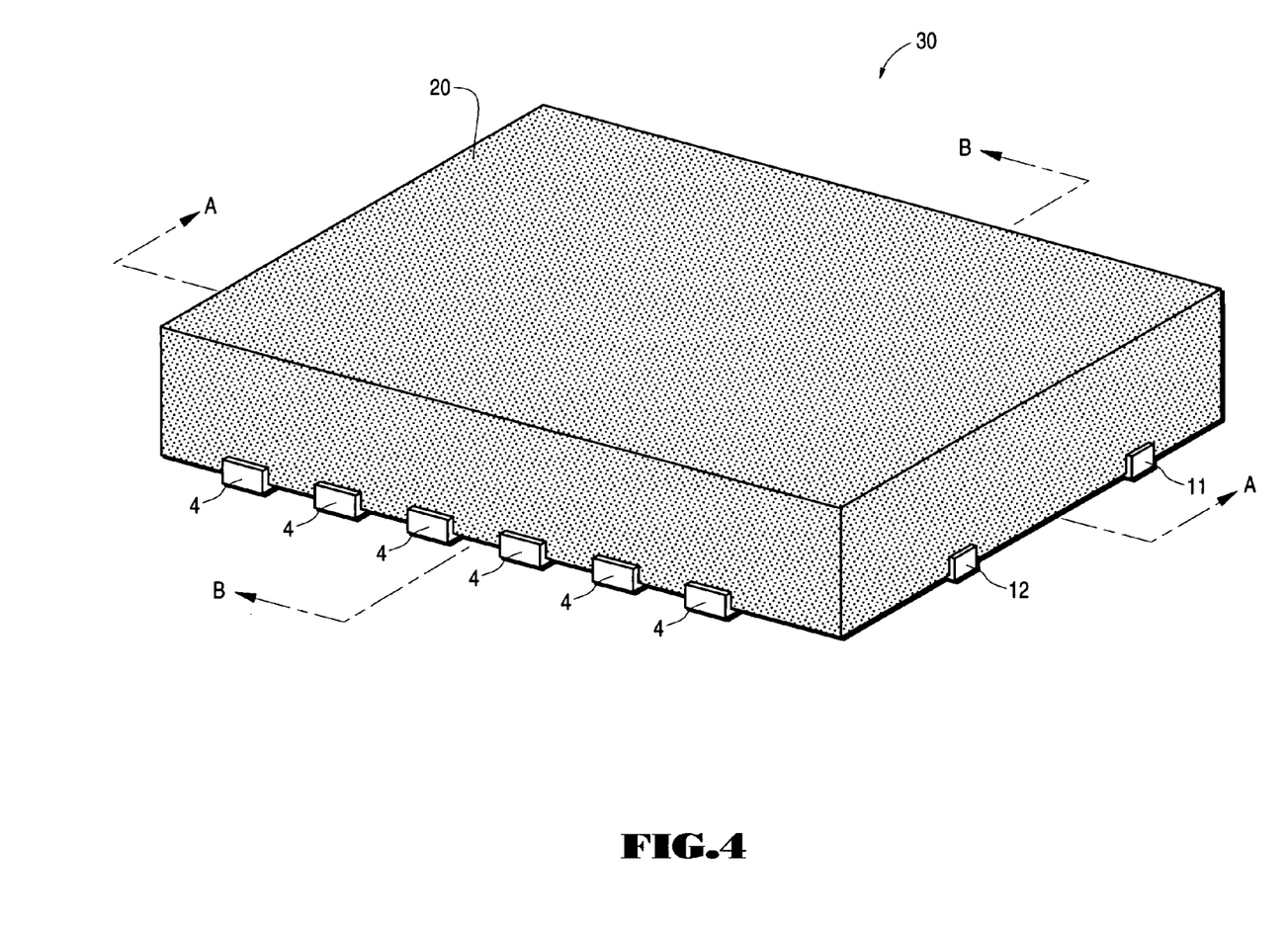
FIG. 4 is a top perspective view of the structure shown in FIG. 3 after a semiconductor die has been attached to the top paddle, after a wire bonding process has been performed, after a molding process has been performed, after a plating process has been performed, and after a singulation process has been performed, so as to form a packaged semiconductor device that is packaged using a micro leadframe package in accordance with one embodiment of the present invention.
Figure 5:
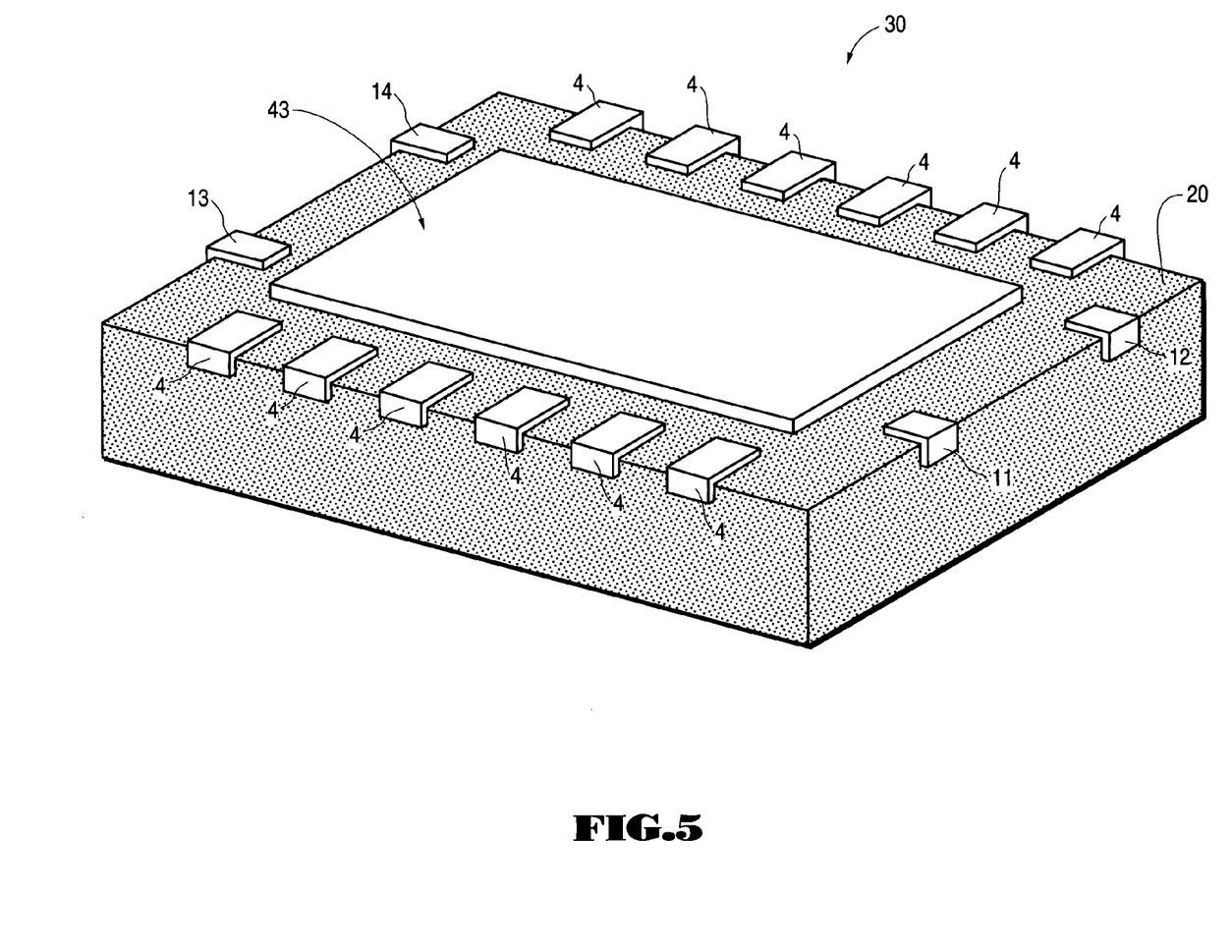
FIG. 5 is a bottom perspective view of the structure shown in FIG. 4 in accordance with one embodiment of the present invention.

A singulation process is then performed. In the present embodiment a saw or punch method is used to singulate individual packaged semiconductor devices. FIGS. 4–5 show an exemplary packaged semiconductor device 30 that is formed in accordance with the present process. In the present embodiment packaged semiconductor device 30 is a micro leadframe package that has four sides, with leads 11–12 extending on one side, leads 13–14 extending on the opposite side, and leads 4 disposed on the other two sides. However, it is appreciated that packaged semiconductor device 30 could have more or fewer leads 4 and 11–14, could have different placement of leads 4 and 11–14, and could have other shapes, as required by the packaging specification.

Figure 6:
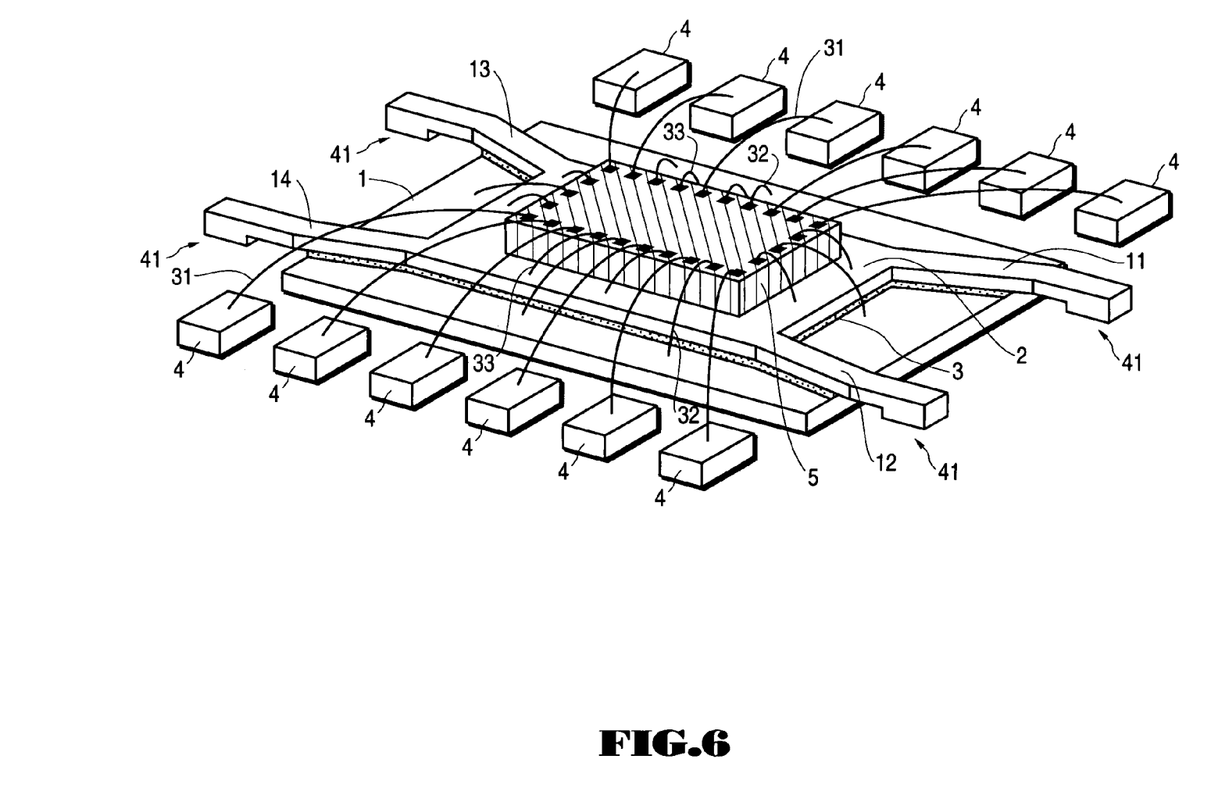
FIG. 6 shows the structure of FIG. 4, with molding compound not shown, in accordance with one embodiment of the present invention.
Figure 7:
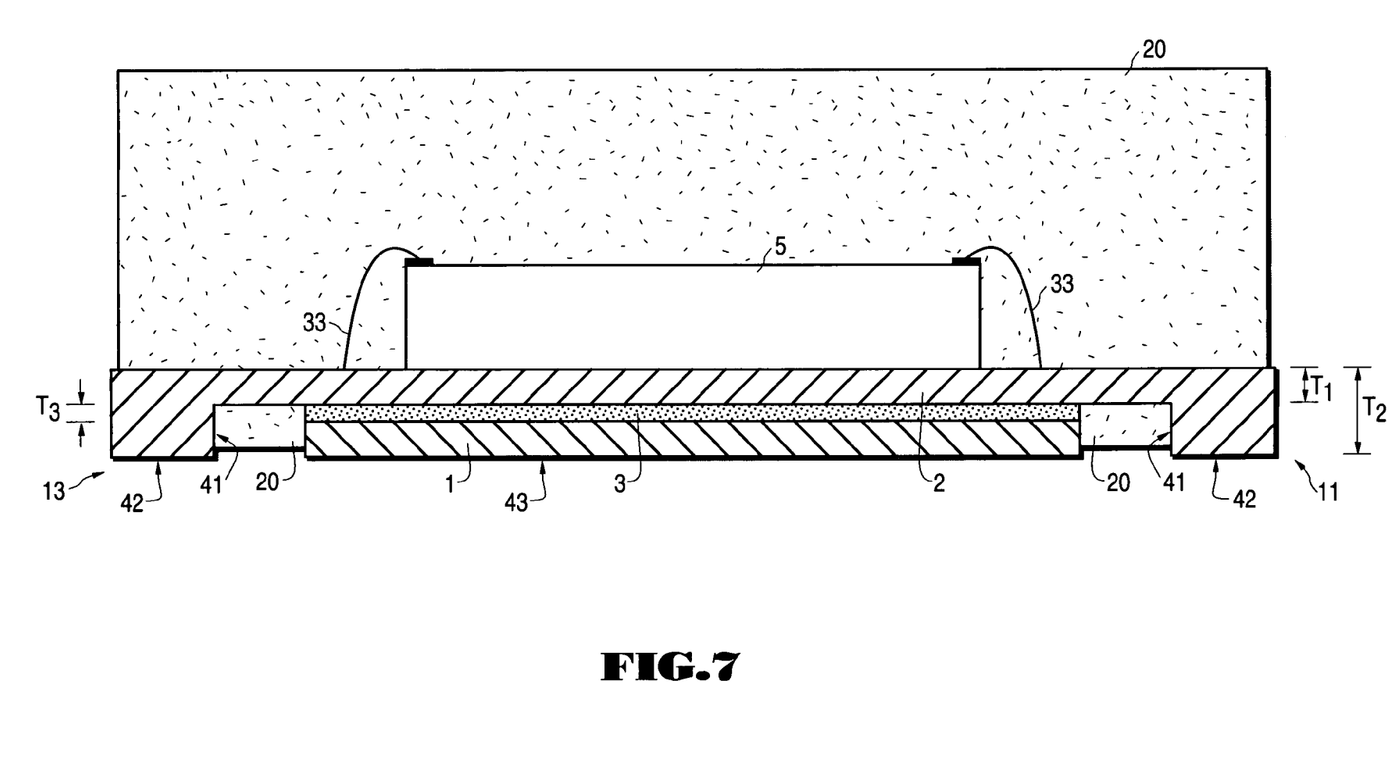
FIG. 7 is cross-sectional view of the structures of FIG. 4, along section A—A, in accordance with one embodiment of the present invention.
Figure 8:
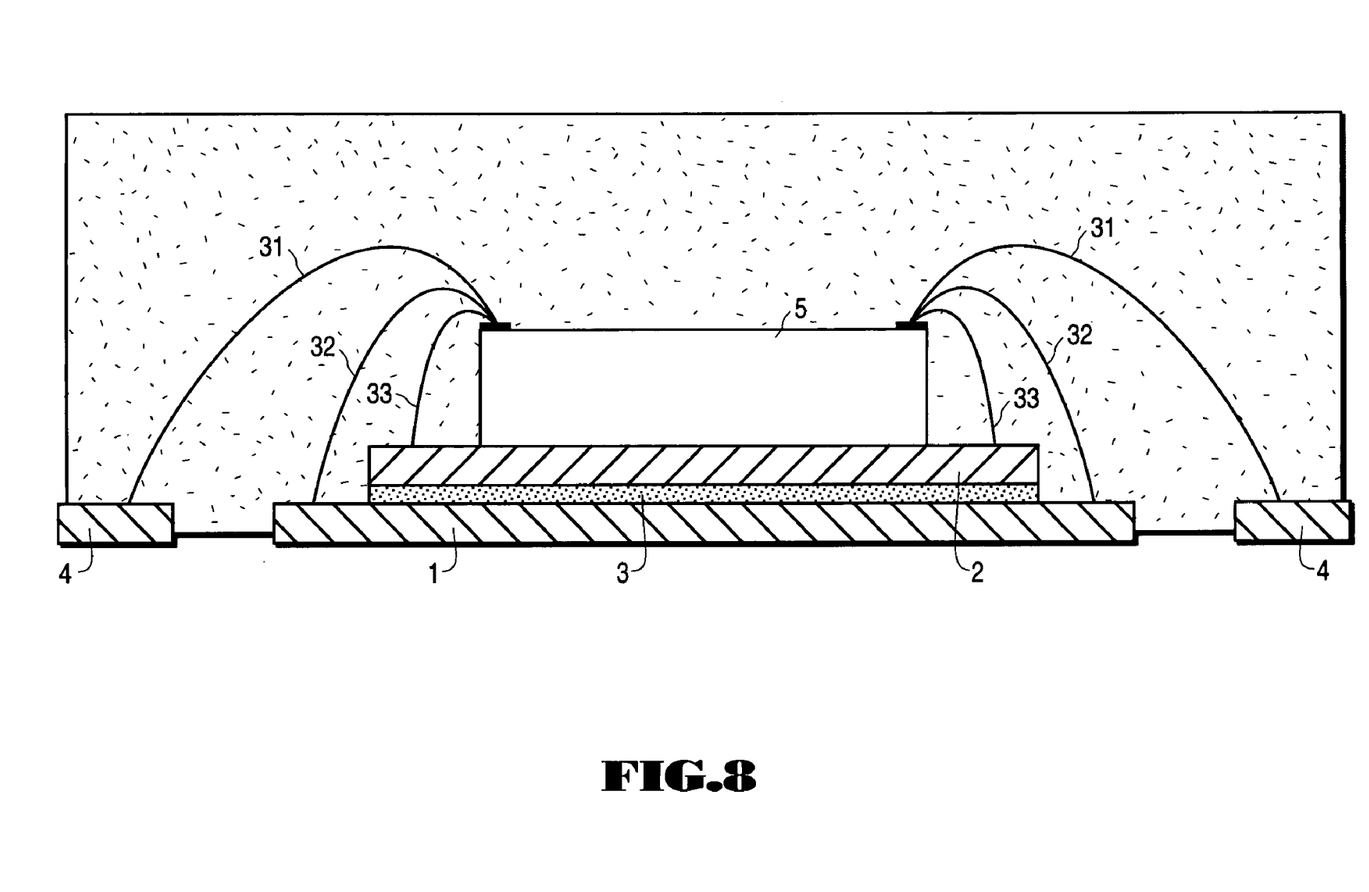
FIG. 8 is cross-sectional view of the structures of FIG. 4, along section B—B, in accordance with one embodiment of the present invention.

Referring now to FIGS. 6–8, in the present embodiment paddle 2 and leads 11–14 are a single integrated part of leadframe 2, with paddle 2 and portions of leads 11–14 having a thickness $T_1$ and a portion of each of leads 11–14, near the ends of leads 11–14 having a thickness $T_2$ that is greater than thickness $T_1$. This thickness variation, when the die are singulated, forms protrusions 41 that extend downward from ends of leads 11–14. In the present embodiment the bottom surface 42 of each protrusion 41 is approximately coplanar with the bottom surface 43 of paddle 1. In one specific embodiment paddles 1–2 have a thickness $T_2$ of 5–6 mils and a thickness $T_1$ of approximately 3 mils, giving dielectric material 3 having a thickness $T_3$ of from 2–3 mils.

Continuing with FIGS. 6–8, leads 4 are spaced apart from paddles 1–2 and are not in direct physical contact with either of paddles 1–2. Molding compound 20 extends over and partially around each of leads 4, physically securing leads 4 to the other components of micro leadframe package 30.

Referring now to FIG. 6, semiconductor die 5 does not cover all of paddle 2, leaving space on all four sides of semiconductor die 5 that can be used to couple contacts on semiconductor die 5 to paddle 2. In the present embodiment wires 33 extend from contacts on semiconductor die 5 to these exposed portions of paddle 2, providing for electrical contact between contacts on semiconductor die 5 and paddle 2. The wire bonding process also forms wires 32 that extend from contacts on semiconductor die 5 to paddle 1. In addition, wires 31 are formed that extend from contacts on semiconductor die 5 to leads 4.

In one embodiment power is coupled to bottom surface 42 of leads 11–14 and ground is coupled to bottom surface 43 of paddle 1. In this embodiment wires 33 extend from power contacts on semiconductor die 5 to paddle 2 and wires 32 extend from ground contacts on semiconductor die 5 to paddle 1. This frees up wires 31 and leads 4 for connection to signal contacts on semiconductor die 5, allowing for packaging of semiconductor die 5 having a high number of power, ground and signal contacts. In addition, as each of wires 32 extend to paddle 1, and since the bottom surface of paddle 1 is a large-surface area connection to the circuit board, a low inductance pathway is provided to the ground contacts of semiconductor die 5. In addition, as multiple wires 33 extend in parallel to paddle 2, a low inductance pathway is provided to the power contacts of semiconductor die 5.

In another embodiment ground is coupled to bottom surface 42 of leads 11–14 and power is coupled to bottom surface 43 of paddle 1. In this embodiment wires 33 extend from ground contacts on semiconductor die 5 to paddle 2 and wires 32 extend from power contacts on semiconductor die 5 to paddle 1. This frees up wires 31 and leads 4 for coupling input and output to semiconductor die 5, allowing for packaging of semiconductor die 5 having a high number of power, ground and signal contacts. In addition, as each of wires 32 extend to paddle 1, and since the bottom surface of paddle 1 is a large-surface area connection to the circuit board, a low inductance pathway is provided to the power contacts of semiconductor die 5. In addition, as multiple wires 33 extend in parallel to paddle 2, a low inductance pathway is provided to the ground contacts of semiconductor die 5.

Accordingly, when ground contacts of semiconductor die 5 are electrically connected to one of paddles 1–2, and power contacts of semiconductor die 5 are connected to the other paddle 1–2, the micro leadframe package of the present invention provides low power and ground impedance. This gives low inductance ground pathways and low inductance power pathways to semiconductor die 5, reducing the likelihood of rail collapse, and allowing for packaging of high frequency semiconductor devices.

As only dielectric material 3 extends between paddle 1 and paddle 2, paddles 1–2 and dielectric material 3 form a capacitor that stores charge for use by semiconductor die 5. More particularly, when one of power and ground signals is supplied to leads 11–14, and the other of power and ground signals is supplied to the bottom surface of paddle 1, electrical charge is stored on one of paddles 1–2. Thereby, the method and apparatus of the present invention provides decoupling capacitance within the micro leadframe package itself. Not only is the decoupling capacitance within the package itself, but also, the decoupling capacitance is very close to semiconductor die 5. In the present embodiment the decoupling capacitance is less than 0.1 inch from the contacts on the die. The close proximity of the decoupling capacitance of the present micro leadframe package provides for effective decoupling capacitance, even for semiconductor die 5 having very high frequencies.

In the present embodiment paddles 1–2 are sized such that they have sufficient surface area to meet the capacitance requirements of the product that is to be packaged. In one embodiment, paddles 1–2 are sized so as to provide the largest possible surface area, while adhering to the packaging specifications for the particular product to be packaged. This forms a micro leadframe package having high surface area paddles 1–2, giving a high-capacitance micro leadframe package. In one embodiment the capacitor of the present invention has a capacitance (C) of 9 microfarad (µf) or greater. When semiconductor die 5 is a 1 Watt device, with a power supply voltage of 3.3 Volts, this provides decoupling capacitance for a time period of approximately 28 nanoseconds, which is sufficient for preventing rail collapse when high frequency semiconductor die 5 are packaged.

In the present embodiment packaged semiconductor device 20 is a semiconductor device 5 that is packaged in a micro leadframe package. However, it is appreciated that the methods of the present invention are applicable to other types of packages such as, for example, conventional leadframe packages, etc.

The embodiments of FIGS. 1–8 are described with reference to applying ground to one of paddles 1–2 and power to the other of paddles 1–2. It is appreciated that power and ground can be any two different voltage levels, such that one voltage is applied to one of paddles 1–2 and a different voltage is applied to the other of paddles 1–2, resulting in the storage of electrical charge on one of paddles 1–2 for use by semiconductor die 5.

Figure 9:
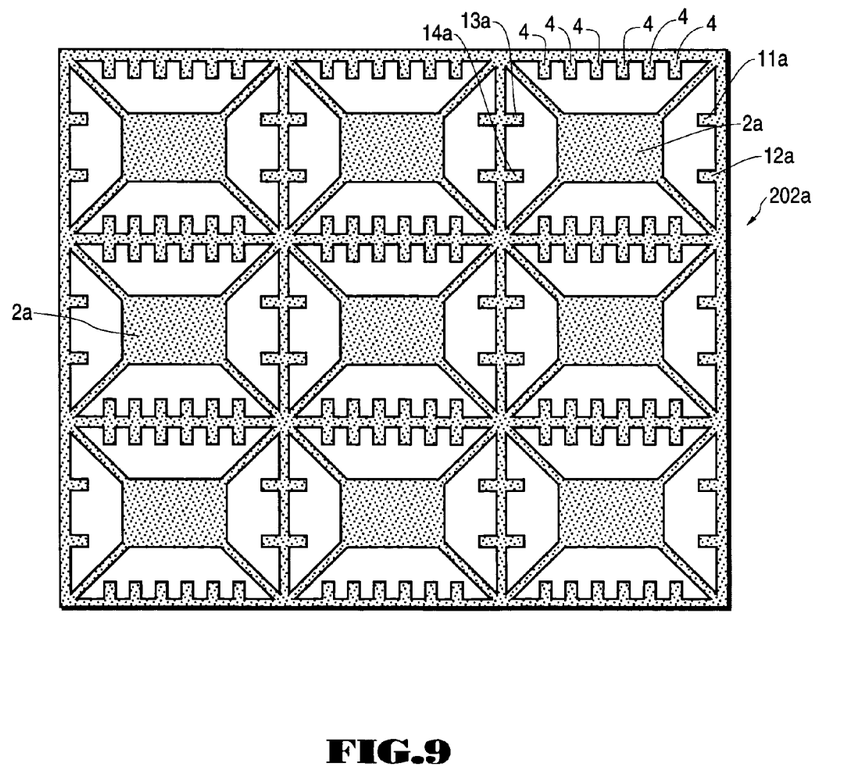
FIG. 9 is a top view of a leadframe that includes paddles and leads, with none of the leads extending from the paddles in accordance with one embodiment of the present invention.
Figure 10:
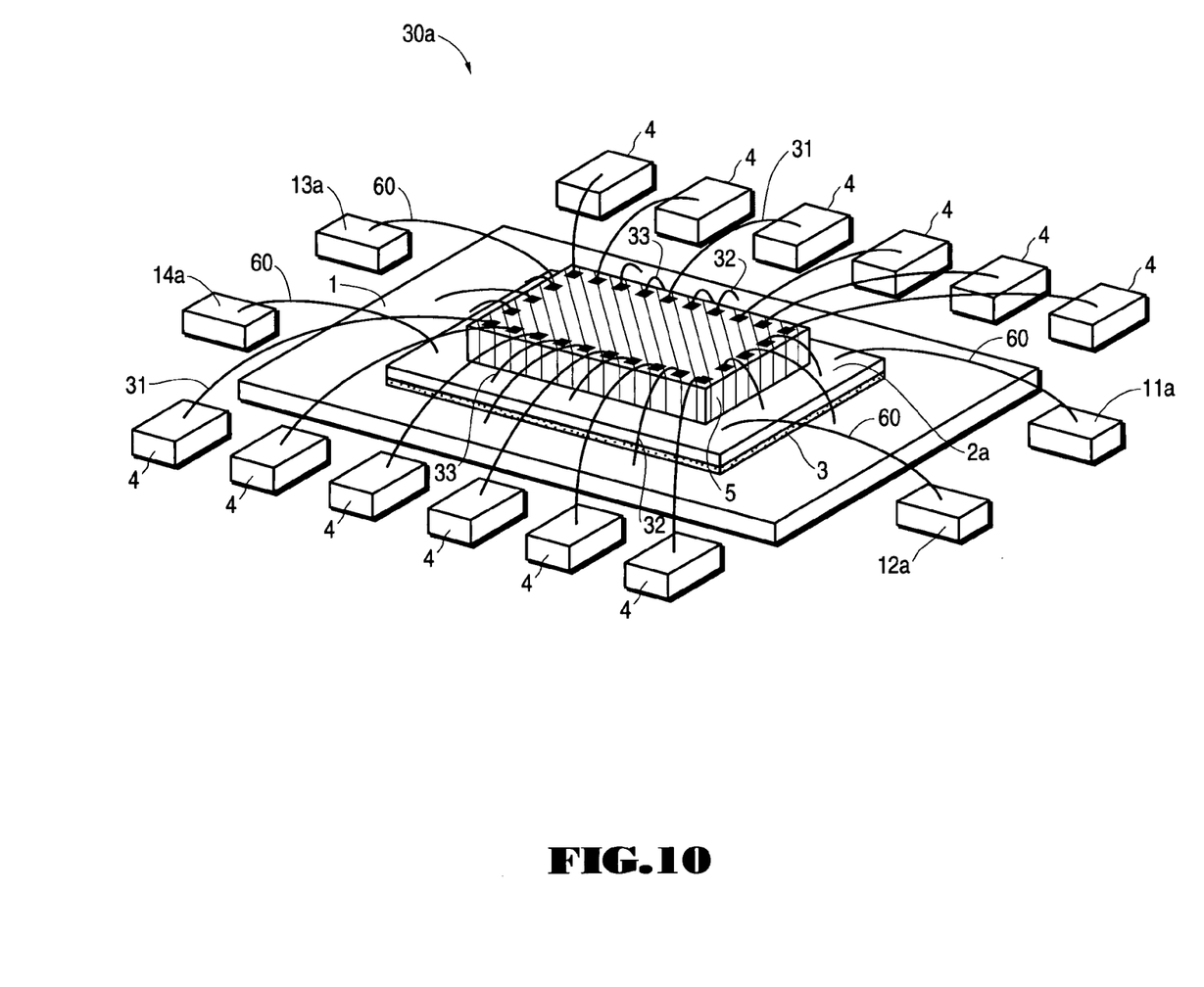
FIG. 10 is cross-sectional view of a packaged semiconductor device, with molding material not shown, that is formed by coupling leadframes 1–2a such that dielectric material extends between the leadframes, filling the space between each paddle of the leadframe of FIG. 1 and the corresponding paddle of the leadframe of FIG. 9, attaching a semiconductor die, performing a wire bonding process, performing a molding process, performing a plating process and performing a singulation process in accordance with one embodiment of the present invention.

In one alternate embodiment that is illustrated in FIGS. 9–10, a leadframe 202a is used that does not include leads that extend from paddle 2a. In this embodiment, all of leads 4, 11a, 12a, 13a and 14a are separated from paddle 2a. Referring now to FIG. 10, wires 60 electrically couple paddle 2a to leads 11a, 12a, 13a, and 14a. Though this embodiment shows two leads (11a and 12a) on the right side and two leads (13a and 14a) on the left side, it is appreciated that, alternatively, additional leads 4 could be located along the left and right sides of package 30a.

Packaged semiconductor device 30a can be formed in the same manner as the embodiment disclosed in FIGS. 1–8. More particularly, leadframes 201 and 202a are coupled together using dielectric material 3 such that dielectric material 3 extends between each of paddles 1 and paddles 2a, attaching a semiconductor die, performing a wire bonding process, performing a molding process, performing a plating process and performing a singulation process. However, in the embodiment shown in FIGS. 9–10, in addition to wires 31–33, the wire bonding process also adds wires 60 that electrically couple paddle 2a to leads 11a, 12a, 13a and 14a.

The preferred embodiment of the present invention is thus described. While the present invention has been described in particular embodiments, it should be appreciated that the present invention should not be construed as limited by such embodiments, but rather construed according to the following claims.

What is claimed is:

1. A micro leadframe package comprising:
a first paddle that is electrically conductive;
a plurality of electrically conductive leads;
a second paddle that is electrically conductive and that is disposed over the first paddle, the second paddle electrically coupled to at least one of the leads;
a first set of wires that extend from the first paddle to contacts of a semiconductor die;
a second set of wires that extend from the second paddle to contacts of a semiconductor die;
dielectric material disposed between the first paddle and the second paddle, the dielectric material having a dielectric constant such that, when a first voltage is applied to the first paddle and a second voltage is applied to the second paddle, electrical charge can be stored on one of the first paddle and the second paddle; and
molding compound disposed over the first paddle, the second paddle, the first set of wires, the second set of wires and the leads, the molding compound extending at least partially around the leads, and the molding compound not covering the bottom surface of the first paddle such that the bottom surface of the first paddle is exposed.

2. A micro leadframe package as recited in claim 1 wherein the molding compound extends around all of the side surfaces of the first paddle.

3. A micro leadframe package as recited in claim 2 wherein the bottom surface of each of the leads is disposed in a plane that is approximately coplanar with the bottom surface of the first paddle.

4. A micro leadframe package as recited in claim 1 wherein the leads include a first set of leads that are integrally formed with the second paddle and extend from the second paddle and include a second set of leads that are disposed such that the second set of leads are not in direct physical contact with either the first paddle or the second paddle.

5. A micro leadframe package as recited in claim 4 wherein the micro leadframe package is a four-sided package, the first set of leads disposed on opposite sides of the micro leadframe package, and the second set of leads disposed on the other sides of the package.

6. A micro leadframe package as recited in claim 1 wherein the leads include a first set of leads that are integrally formed with the second paddle and extend from the second paddle, each of the leads in the first set of leads having an elongated region and a protrusion that extends downward from the elongated region, the molding compound extending beneath the elongated region so as to encapsulate the elongated region, and the molding compound not extending beneath the protrusion so as to expose the bottom surface of the protrusion.

7. A packaged semiconductor device comprising:
a first paddle that is electrically conductive;
a second paddle that is electrically conductive and that is disposed over the first paddle;
a first set of electrically conductive leads that are integrally formed with the second paddle and that extend from the second paddle, each of the leads in the first set of leads including an elongated region and a protrusion that extends to the end of each lead in the first set of leads, the protrusion having a thickness that is greater than the thickness of the elongated region;
a second set of electrically conductive leads, the second set of leads not in direct physical contact with either the first paddle or the second paddle;
a semiconductor die attached to the second paddle;
a first set of wires that extend from the first paddle to one of power and ground contacts of the semiconductor die;
a second set of wires that extend from the second paddle to the other of power and ground contacts of the semiconductor die;
dielectric material disposed between the first paddle and the second paddle; and
molding compound disposed over the first paddle, the second paddle, the first set of wires, the second set of wires, the first set of leads and the second set of leads, the molding compound not covering the bottom surface of the first paddle such that the bottom surface of the first paddle is exposed and not covering the bottom surface of the leads in the second set of leads such that the bottom surface of each of the leads in the second set of leads is exposed, and not covering the bottom surface of the protrusion such that the bottom surface of the protrusion is exposed.

8. A packaged semiconductor device as recited in claim 7 wherein the protrusion extends downward such that the bottom surface of the protrusion is approximately coplanar with the bottom surface of the first paddle.

9. A packaged semiconductor device as recited in claim 8 wherein the bottom surface of each of the leads in the second set of leads is disposed in a plane that is approximately coplanar with the bottom surface of the first paddle.

10. A packaged semiconductor device as recited in claim 7 wherein the first paddle is wider than the second paddle such that portions of the first paddle are not covered by the second paddle, the second set of wires coupled to that portion of the first paddle that is not covered by the second paddle.

11. A packaged semiconductor device as recited in claim 7 wherein the dielectric material has a dielectric constant such that, when one of power and ground signals is supplied to the first set of leads, and the other of the power and ground signals is supplied to the bottom surface of the first paddle, electrical charge is stored on one of the first paddle and the second paddle.

12. A packaged semiconductor device as recited in claim 10 wherein the first set of leads comprise at least one lead that extends from one side of the second paddle and at least one lead that extends from the opposite side of the second paddle.

13. A packaged semiconductor device as recited in claim 7 wherein the dielectric material comprises dielectric adhesive, only the dielectric adhesive extending between the first paddle and the second paddle.

14. A packaged semiconductor device as recited in claim 7 further comprising a third set of wires that electrically couple the second set of leads to contacts on the semiconductor die.

* * * * *

UNITED STATES PATENT AND TRADEMARK OFFICE
CERTIFICATE OF CORRECTION

PATENT NO. : 7,166,905 B1
APPLICATION NO. : 10/958697
DATED : January 23, 2007
INVENTOR(S) : Shah It is certified that error appears in the above-identified patent and that said Letters Patent is hereby corrected as shown below:

Title Page item [56]

In the References Cited, U.S. Patent Documents, add the following:

| | | |
|---|---|---|
| 6,605,866 | 8/2003 | Crowley, et al. |
| 6,258,624 | 7/2001 | Corisis |
| 6,229,202 | 5/2001 | Corisis |
| 6,211,960 | 4/2001 | Hembree |
| 6,150,714 | 11/2000 | Andreycak, et al. |
| 6,048,750 | 4/2000 | Hembree |
| 5,739,585 | 4/1998 | Akram, et al. |
| 5,674,785 | 10/1997 | Akram, et al. |

Signed and Sealed this

Twenty-fourth Day of July, 2007

JON W. DUDAS
*Director of the United States Patent and Trademark Office*